(12) United States Patent
Fahs et al.

(10) Patent No.: US 8,427,388 B2
(45) Date of Patent: Apr. 23, 2013

(54) EIGHT-SHAPED RF BALUN

(75) Inventors: Bassem Fahs, Caen (FR); Lionel Guiraud, Blainville-sur-Orne (FR); Hendrik Visser, Wijchen (NL)

(73) Assignee: ST-Ericsson SA, Plan-Les-Ouates (CH)

( * ) Notice: Subject to any disclaimer, the term of this patent is extended or adjusted under 35 U.S.C. 154(b) by 340 days.

(21) Appl. No.: 12/953,138

(22) Filed: Nov. 23, 2010

(65) Prior Publication Data
US 2011/0148733 A1    Jun. 23, 2011

Related U.S. Application Data

(63) Continuation-in-part of application No. PCT/EP2009/056355, filed on May 26, 2009.

(30) Foreign Application Priority Data

May 29, 2008   (EP) ..................................... 08157203

(51) Int. Cl.
*H01Q 1/50*   (2006.01)
*H03H 7/42*   (2006.01)

(52) U.S. Cl.
USPC ............................................ 343/859; 333/25

(58) Field of Classification Search .................. 343/859; 333/25; 336/200
See application file for complete search history.

(56) References Cited

U.S. PATENT DOCUMENTS

| 5,451,914 | A | * | 9/1995 | Stengel | ........................... 333/25 |
| 5,477,204 | A | * | 12/1995 | Li | ................................. 336/200 |
| 5,497,137 | A | * | 3/1996 | Fujiki | ........................... 336/200 |
| 6,097,273 | A | * | 8/2000 | Frye et al. | ..................... 336/200 |
| 7,199,682 | B2 | | 4/2007 | Ezzeddine | |
| 7,623,006 | B2 | * | 11/2009 | Ezzeddine et al. | ............. 333/131 |
| 7,952,458 | B2 | * | 5/2011 | Ezzeddine | ................... 336/200 |
| 2004/0182602 | A1 | | 9/2004 | Satoh | |

* cited by examiner

*Primary Examiner* — Huedung Mancuso
(74) *Attorney, Agent, or Firm* — Coats & Bennett, P.L.L.C.

(57) ABSTRACT

Symmetrical eight-shaped balun (BALanced-to-UNbalanced converter) comprising a first and second eye, each eye comprising conducting tracks forming turns. The eyes comprise an equal number of primary turns that form a first conducting path from a first terminal to a second terminal, in which in operation electrical current flows in a first direction in a first eye and in a second direction in a second eye. Moreover, the eyes further comprise an equal number of secondary turns that form a second conducting path from a third terminal to a fourth terminal, in which in operation electrical current flows in a first direction in a first eye and in a second direction in a second eye. The geometrical and electrical middle points of primary and secondary turns are all superposed and further are located in the same plane.

12 Claims, 9 Drawing Sheets

EIGHT-SHAPED RF BALUN

This Continuation-In-Part application claims priority from PCT patent application no. PCT/EP2009/056355, filed May 26, 2009, titled "RADIO FREQUENCY EIGHT-SHAPED BALUN" (published as WO 2009/144211), and EP provisional patent application 08157203.4, filed May 29, 2008, both of which are incorporated herein by reference in their entireties.

FIELD OF THE INVENTION

The invention relates to a Balanced-to-Unbalanced (BALUN) component.

BACKGROUND

A balun is a device that joins a balanced line (one that has two conductors, with equal currents in opposite directions, such as a twisted pair cable) to an unbalanced line (one that has just one conductor and a ground, such as a coaxial cable). A balun is a type of transformer: it is used to convert an unbalanced signal to a balanced one or vice versa. Baluns isolate a transmission line and provide a balanced output. A typical use for a balun is in a television antenna. The term is derived by combining balanced and unbalanced.

Figure 1:
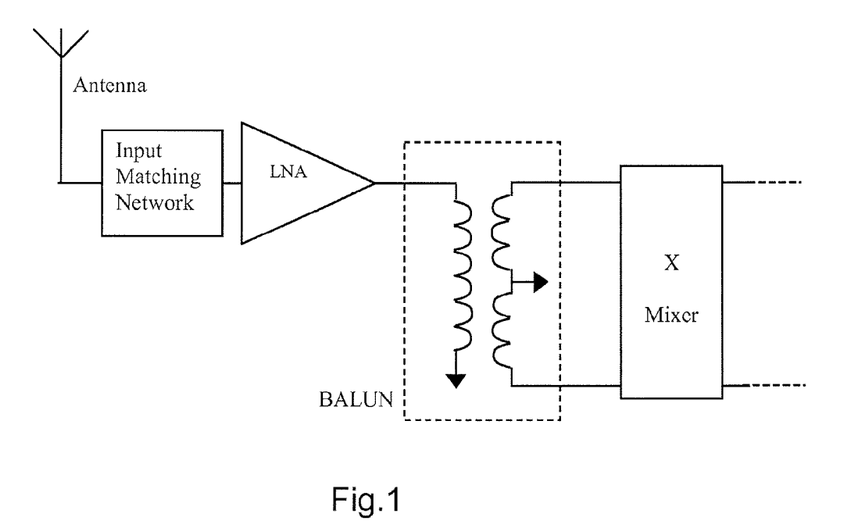
FIG. 1. Receiver path showing the use of a balun between the LNA and the mixer.
Figure 2:
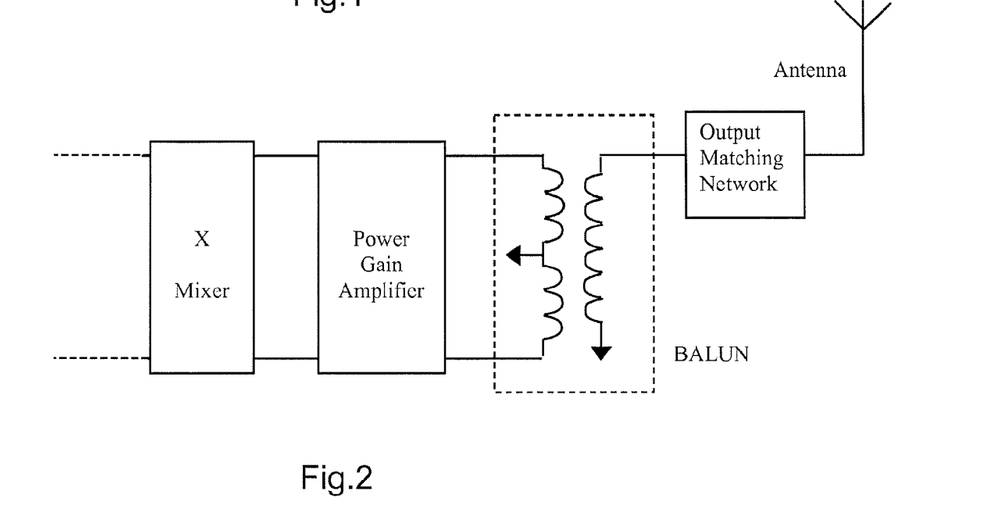
FIG. 2. Transmitter path with the balun placed between the last amplification stage and the output-matching network.

Integrating components, like baluns, becomes a real requirement if not a vital need in Radio-Frequency circuits. Balun components are frequently used in radio-frequency circuits, mainly to ensure impedance transformation, and signals differential to single-ended conversion, or vice-versa. FIGS. 1 and 2 are given to show for instance block diagrams with balun use, respectively through a receiver and a transmitter path.

In a balun, one pair of terminals is balanced, that is, the currents are equal in magnitude and opposite in phase. The other pair of terminals is unbalanced; one side is connected to electrical ground and the other carries the signal. Balun transformers can be used between various parts of a wireless or cable communications system.

In FIG. 1, a balun is used after a Low Noise Amplifier (LNA) to convert single-ended received signals to differential at a mixer's input.

In FIG. 2, a balun is used after the last amplification stage, to convert output differential signals to single-ended before being connected to an antenna throughout an output matching network.

In the receiver case some problems occur. The balun, being naturally placed before the mixer and almost at the beginning of the receiver chain, presents a high sensitivity level to coupled magnetic fields and interferers, which could seriously impact the global receiver performances. The need of a low-sensitivity balun to radiated magnetic fields and interferers becomes crucial.

Furthermore, the output differential impedance presented to the mixer has to prevent a mismatch that will impact the even-harmonic rejection of the mixer and may generate even harmonic distortion.

Also, attention has to be paid to the balun's insertion loss, since a high insertion loss will directly impact the input noise figure.

In the transmitter case some problems occur. The balun, carrying high power signals, becomes then a very high noise radiation source. A need for low magnetic field radiation structure is present.

Furthermore, it should be prevented that common mode signals and noise will be converted to the single-ended output.

Also low insertion loss is required to save power.

Thus, such components are commonly used in communications devices to achieve impedance transformation and single-ended to differential conversion or vice-versa. However, many prior art components do not ensure low magnetic field radiation and low sensitivity to coupled interferers. Further, components are not provided wherein a mutual coupling helps to realize a balun in a compact space area. Proposed structures no not correct for many other drawbacks and issues, as the ones mentioned above. Typically the prior art baluns further considerably increases the insertion loss characteristics, and suffers form common mode injected noise.

Further, it is important for a balun to have low magnetic field radiation and low sensitivity to coupled interferers.

U.S. Pat. No. 5,477,204 describes a balun as shown in FIG. 3. This disclosure is regarded as closest prior art.

Figure 3A:
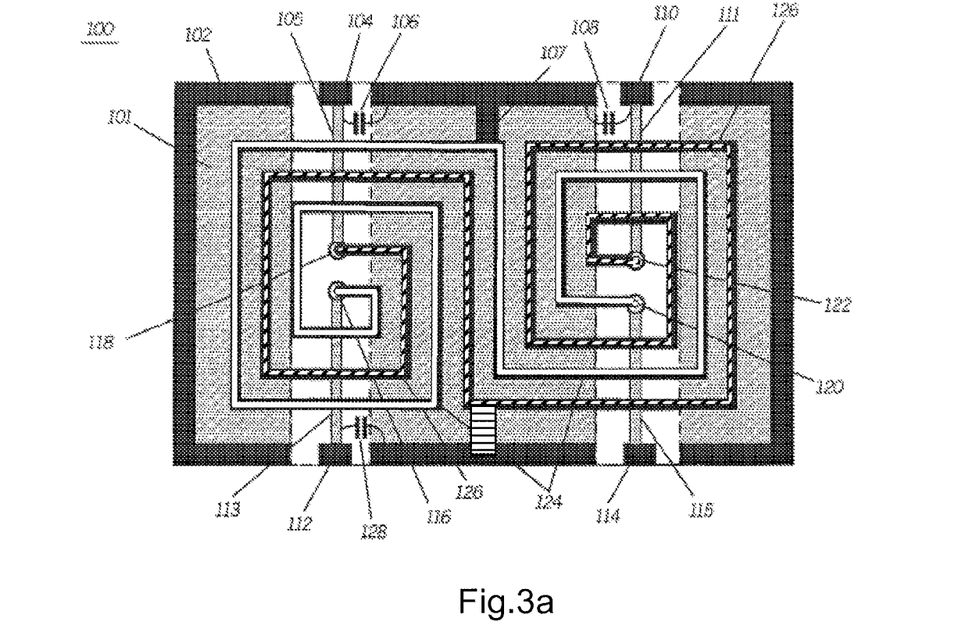
FIG. 3A. Prior Art balun (from U.S. Pat. No. 5,477,204)
Figure 3B:
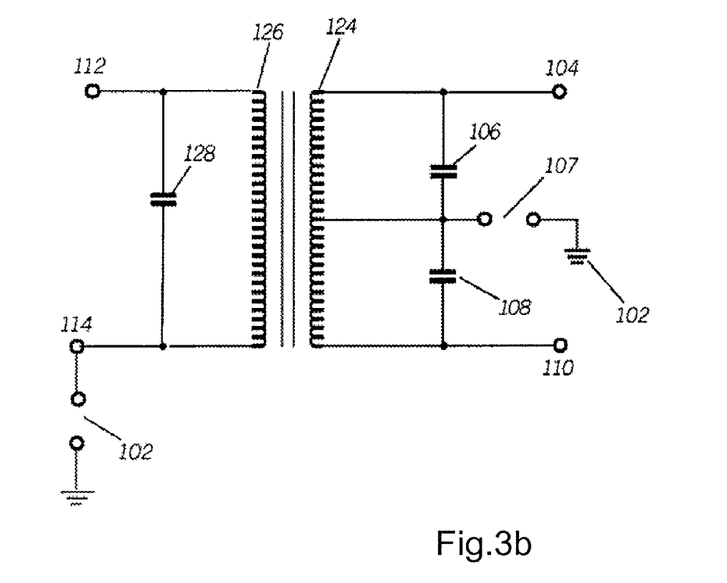
FIG. 3B. Electrical schematic relative to the prior art (FIG. 3A)

In fact, in order to match the layout and the electrical schematic in the above disclosure (FIGS. 3A & 3B), the 107 connection has to be shifted to the bottom side—where the dashed rectangle is added—so it becomes connected in series to 104, as FIG. 3B says. Actually, as it's drawn on FIG. 3A, the 107 is connected in series to 112, instead of 104, and 112 is the single-ended input of the balun, which does not seem to make sense.

The main problem of this structure lies in the coupling and magnetic transfer between the primary and secondary loops. The length of wires comprising the primary (116-120) and secondary (118-122) are well equal, as the patent mentions it. However, and due to its structure, the primary (routed in white) is longer and has more turns than the secondary (routed in dashed) on the left side, and shorter with less turns on the right side. This leads to the following drawbacks.

Further, the actual geometrical middle points of the primary and secondary are not located closely to each other. As it is, this will result in a transfer from the primary to the secondary loops.

Figure 3C:
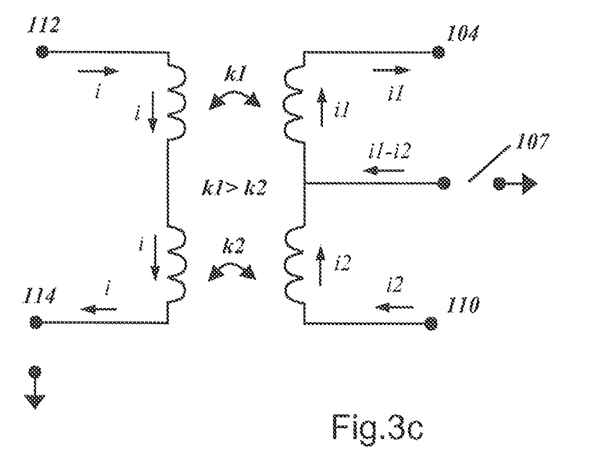
FIG. 3C. Electrical schematic relative to FIG. 3A, with figured primary and secondary currents.

Since the primary has more turns than the secondary on the left side and less on the right, the consequence is that the generated current by induction in the secondary will be higher in the left loop (i1) than in the right loop (i2) (see FIG. 3C). This is a serious drawback.

Further, the output current (104, 110), and output impedance are not any longer fully differential, and a mismatch is created.

A next drawback is that a part of the induced current (i1-i2), will flow to the ground via 107, and as such it will degrade the insertion loss, since this current is regarded as a wasted power.

It is noted that the crossed coupling coefficients do not change anything to these conclusions, since they will add equal contributions. Therefore, the disadvantages mentioned above remain existent.

Now if we look at this balun, as a differential to single-ended transformer, we 25 will find the same disadvantages, namely: the input impedance not being fully differential; and there is degraded insertion loss due to the current conduction through 107.

Furthermore, another drawback can be mentioned in this case, which is the bad rejection of any common mode noise or signal injected at the balanced side input (104, 110), which will result in an undesirable output current on the unbalanced side (112, 114), due to the couplings between the primary and secondary loops.

Thus, the disclosed balun in U.S. Pat. No. 5,477,204 still has many disadvantages. Several other baluns are known from the prior art.

U.S. Pat. No. 6,683,510 A1 (D1) discloses a coupled transmission line balun construction that employs two pairs of planar interleaved spiral coils formed on an electrically insulating or semi-insulating substrate defining a planar structure. One coil in each pair is connected in series to define the input transmission line of the balun, with one end of that transmission line being open circuit The balun provides an ultra-wide bandwidth characteristic in the frequencies of interest for MMIC devices, is fabricated using the same techniques employed with fabrication of MMIC devices, and is of a physical size that lends itself to application within MMIC devices. The balun is symmetrical about its centre line. The first and the second loops have the same length and number of turns in the right and left side.

However, U.S. Pat. No. 6,683,510 A1 does not describe that the balun is eight-shaped and the geometrical and electrical middle point are superposed and at the same level. These features are not known.

U.S. Pat. No. 7,199,682 B1 (D2) discloses a mode-switching transformer having a first conductive line formed of two primary windings electrically in series, and the length of which is a function of a central operating frequency of the transformer; and a second conductive line formed of two secondary windings electrically in series, coupled two-by-two with the primary windings, the length of which is a function of said central frequency. The conductive lines exhibit different widths selected according to the desired impedance ratio of the transformer.

US 2006/097820 A1 (D3) discloses a printed circuit board built-in type planar balun which can be easily incorporated in a printed circuit board without increasing the number of layers and lowering the functions thereof is provided. A balanced signal transmission line 1 and an unbalanced signal transmission line 2 are formed on a same plane, with the sides being opposed to each other. Dielectric layers 3 are provided between these transmission lines, and between the transmission line and a ground potential layer 4, which is arranged substantially parallel to the lines 1 and 2 and spaced at a predetermined distance.

U.S. Pat. No. 6,653,910 B1 (D4) discloses a monolithically integrable spiral balun comprising a substrate having first, second, third, and fourth transmission lines formed thereon. The first transmission line has a first end coupled to receive an input signal and has a second end. The first transmission line forms a spiral that winds in a first direction from its first end to its second end. The second transmission line has a first end and has a second end electrically coupled to the second end of the first transmission line. The second transmission line forms a second spiral that winds in a second direction from its first end to its second end. The third transmission line has a first end for providing a first output and a second end for coupling to a first potential. The third transmission line forms a third spiral that interleaves the first spiral and winds in the second direction from its first end to its second end. A fourth transmission line has a first end for providing a second output and a second end for coupling to a second potential. The fourth transmission line forms a fourth spiral that interleaves the second transmission line and winds in the first direction from its first end to its second end.

EP 1424770 B1 (D5) discloses a wide band mixer is provided that mitigates local oscillator leakage. A LO signal is provided to a 180 degree splitter that provides a first intermediate LO signal and a second intermediate LO signal 180 DEG out of phase from one another. Since both the first and second intermediate LO signals are 180 DEG out of phase, the fundamental LO leakage is mitigated at the RF port by the in-phase combination of the 180 DEG out of phase LO tones canceling one another out and providing strong LO/RF rejection. An RF or microwave input signal is provided to a power splitter to provide a first intermediate RF signal and a second intermediate RF signal. The first intermediate LO signal is mixed with the first intermediate RF signal and the second intermediate LO signal is mixed with the second intermediate RF signal to provide an intermediate frequency signal at the output of the mixer.

U.S. Pat. No. 5,818,308 A1 (D6) discloses a coupled line element that has a plurality of coupled lines equalized to each other in line length to set a phase difference between output signals within a desired range. The coupled lines are wound to form a spiral section. An extension is formed continuously with an end of one or more of the coupled lines fanning an inner winding in the spiral section. The line length of this coupled line is thereby equalized to that of the coupled line forming an outermost winding in the spiral section. Alternatively, the coupled lines can be formed into two spiral sections that are wound in opposite directions.

US 2006/087383 A1 (D7) discloses a balun including a pair of metal coil structures and an intervening dielectric layer having a thickness that is selected in response an operating frequency of the balun. The thickness of the dielectric layer may be used to tune the balun and enhance its self-inductance at its operating frequency. In addition, a balun with a pair of metal coil structures formed with an asymmetry that is selected to minimize an amplitude error in its output signal. A balun according to the present teachings may also include an asymmetry in the positioning of its output terminals. The positioning of the output terminals of a balun may be adjusted to minimize phase errors at its output signal.

In summary, D2-D5 describe symmetrical baluns. D6 mentions that the sides are symmetrical, but the figure shows asymmetry in terms of length of the loops. D7 discloses an asymmetric balun.

Further, D1, D3-D5 and D7 disclose a so-called "anti-8" structure, and further D5 proposes in FIGS. 5 and 6 a combiner/splitter design rather than a balun.

An anti-8-shaped structure has its currents flowing in the same directions on right and left loops. This creates external magnetic far-fields in the same directions, which will be summed, and increases therefore the radiation and coupling characteristics of such a device. The mutual coupling will also decrease since internal fields are in opposite directions inside each loop. Thus, the "Anti-8-shape" structure presents globally less performance, regarding mainly coupling and inductance value.

Also, U.S. Pat. Nos. 6,097,273 and 6,396,362 disclose baluns, which are based on the principle of an anti-eight shaped structure. The currents flow in such a way that, instead of increasing the internal field and decreasing the external one, the resulting magnetic fields tend to lessen each other inside the turns and enhance the outside field, and that has a direct degrading consequence on the insertion loss levels and magnetic transfer efficiency.

A problem with the above disclosures is that no baluns are provided that have low magnetic field radiation and low sensitivity to coupled interferers.

Thus, prior art baluns suffer from one or more of the above problems or drawbacks. Thus, there is still a need to solve one or more of the above problems and/or overcome one or more of the drawbacks, by providing further optimized baluns.

Thus, the present invention aims to solve one or more of the above-mentioned problems, such as with insertion loss.

SUMMARY

The present invention presents a new symmetrical eight-shaped balun ensuring amongst others low magnetic field radiation and low sensitivity to coupled interferers, with a mutual coupling helping to realize the balun in a compact space area, as well as devices comprising said balun. Further, the proposed structure corrects many drawbacks and issues of the prior art, such as those mentioned above. It features highly symmetrical magnetic transfer and highly differential impedance on the balanced side, which considerably minimizes the insertion loss characteristics, and ensures high immunity to common mode injected noise.

The balun structure according to the invention is able to overcome and correct all or most of these and the above problems, as will be shown in the next paragraph in detail.

In the present 8-shaped structure, currents are flowing in opposite directions on right and left loops. This is to create external magnetic far-fields in opposite directions that cancel each other, while increasing the mutual inductance between loops since the internal magnetic fields are in the same direction.

BRIEF DESCRIPTION OF THE DRAWINGS

FIGS. 6A, 6B & 6C. Examples illustrating the flexibility in connecting the unbalanced terminals whether on FIG. 6A: the same or opposite side than the balanced terminals (jointly or crossed configuration).

DETAILED DESCRIPTION

In a first aspect the present invention relates to a symmetrical eight-shaped balun (BALanced-to-UNbalanced) component comprising a first and second eye, wherein each eye comprises conducting tracks forming turns, wherein the eyes comprise an equal number of primary turns, in which primary turns in operation an electrical current flows in a first direction in a first eye and in a second direction in a second eye, which primary turns form a first conducting path from a first terminal to a second terminal, wherein the eyes further comprise an equal number of secondary turns, in which secondary turns in operation an electrical current flows in a first direction in a first eye and in a second direction in a second eye, which secondary turns form a second conducting path from a third terminal to a fourth terminal, wherein geometrical and electrical middle points of primary and secondary turns are all superposed and further are located in the same plane in the balun.

The present balun has an 8-shape, which 8 shape is substantially symmetrical. The 8-shape comprises a first and second eye, each eye comprising conducting tracks forming one or more turns. The conducting tracks are preferably formed of a metal, such as copper, aluminum, tungsten, or combinations thereof. The tracks may have a width of 1-50 μm, such as 30 μm, and may have a thickness of 1-30 μm, such as 10 μm. Note that the present drawings represent baluns in general, such as those that are also applicable in a PCB domain, having similar relative dimensions but being in the mm range, in contrast to the μm range mentioned above. Thus, the present blauns are applicable in a very wide dimension range.

Within the turns, an electrical current may flow when the balun is in operation. Primary and secondary turns are distinguished, also for the purpose of identifying the electrical current therein. Within an eye, an electrical current runs in a first direction in the primary turn, e.g. clockwise, whereas it runs in a second direction in the secondary turn, e.g. anti-clockwise, or vice versa. Further, the current of a primary turn in the first eye runs in another direction as the current of a primary turn in the second eye, e.g., clockwise and anti-clockwise, respectively, or vice versa. As a consequence, the current of a primary turn in the first eye runs in the same direction as the current in the secondary turn of the second eye, and vice versa for the primary turn in the second eye and the secondary turn of the first eye, e.g., clockwise and anti-clockwise, or vice versa.

The geometrical middle point (13) is a virtual point, which reflects the center of the 8-shaped balun, comparable to a geographical center or a mass center assuming equal masses. In fact, it comprises a 2-fold symmetry axis, perpendicular to the main plane of the balun, in which main plane the tracks are located. Further, the electrical middle point (13) coincides with the geometrical middle point. As such, the electrical middle point also comprises the two-fold symmetry axis. Because of the unique positioning of the tracks, forming a substantially symmetrical balun, electrical path lengths from a terminal to another terminal are divided into two equal lengths by the electrical middle point. The same holds for the geometrical middle point. The form of the eyes may be substantially circular, rectangular, such as square, hexagonal, octagonal, or multigonal, but preferably is substantially circular, such as circular. A circular eye provides the best performance, in any of the above-mentioned aspects.

Further, the 8-shape is preferably such that the length (in FIG. 4a from left to right) is from 0.8-3.0 times the width (in FIG. 4a from bottom to top) of the 8-shape, preferably from 1.2-2.5 times the width, such as approximately 2 times. Such an 8-shape provides a substantially circular eye, providing e.g. the best magnetic performance.

In a preferred embodiment the present balun has primary and secondary turns, that is in comparing the primary left and right, and secondary left and right, respectively, (see above) which have a substantially equal electrical resistance and substantially equivalent capacitive parasitic components. The electrical resistance is a characteristic of material used, such as that of the conducting track, such as that of a metal used, the width, and the thickness of the tracks. Thus, these characteristics of the materials used, or the combinational effect of these characteristics, but preferably all individual characteristics, such as track length, thickness, etc., are consequently substantially equal. The present invention aims to have the respective electrical resistance within 5% of each other, preferably within 2%, more preferably within 1%, even more preferably within 0.5%, such as within 0.1%, preferably being equal to each other as much as possible. It is also aimed to have capacitive parasitic components within 5% of each other, preferably within 2%, more preferably within 1%, even more preferably within 0.5%, such as within 0.1%, preferably being equal to each other as much as possible. This is achieved by the present layout, wherein the balun is fully symmetrical. This is to preserve symmetry, and consequently ensure, e.g., the ensemble of, e.g., following advantages: superposition of electrical and geometrical middle-points, and improvement of single-ended to differential conversion or vice-versa, insertion loss, and immunity to common-mode noise.

In a preferred embodiment, the present balun has a magnetic coupling between primary and secondary turns, which have equal values, on left and right turns of the balun. So the magnetic coupling between the primary left and right, and secondary left and right, respectively, is within 5% of each other, preferably within 2%, more preferably within 1%, even more preferably within 0.5%, such as within 0.1%, preferably being equal to each other as much as possible. This is achieved by optimizing the layout as described above. This is, e.g., to preserve symmetry, and consequently ensure the ensemble of advantages cited previously. Besides, it helps to enhance the efficiency in reducing outside magnetic coupling.

In a preferred embodiment, the present balun has balanced internal terminals (17, 20) which are connected to external terminals (16, 19) using another metal layer (15, 18) than the top metal layer used to draw the body of the balun, which metal layer crosses the full layout of the balun, in order to provide substantially equal capacitive loads to primary and secondary turns, respectively, and left and right turns, respectively. This is to preserve symmetry, and consequently ensure, e.g., the ensemble of advantages cited previously.

In a preferred embodiment, the present balun has connections with another metal layer (15, 18) which are connected to the balanced internal terminals (17, 20) at the middle axis level of the balun's layout, in order to present equal resistive paths to left and right turns. This is to preserve symmetry, and consequently ensure, e.g., the ensemble of advantages cited previously.

In a preferred embodiment the present balun further comprises an inferior metal layer (14), wherein the balanced balun's middle point (13) is connected outwardly with an inferior metal layer (14), crossing the full layout, such to present equal capacitive loads to primary and secondary, left and right turns, respectively. This is to preserve symmetry, and consequently ensure, e.g., the ensemble of advantages cited previously.

In a further aspect, the present invention relates to a wireless modem, broadcast receivers, broadcast transmitters, device to convert single-ended signals to differential or vice-versa, or impedance transformer, or combinations thereof, comprising a symmetrical eight-shaped balun according to according to the invention. The balun may be an individual component of such a device, or may form part of an IC, the IC being a further aspect of the invention, which IC is incorporated in the device.

In yet a further aspect the present invention relates to a device, specifically an RF device, such as for mobile or portable space, such as WiMax/Wibro, TvoM, GSM, EDGE, UMTS, CDMA, Bluetooth, Wireless LAN, or receivers, such as a television receiver, FM broadcast receiver, dipole antenna, and parallel-wire transmission line, comprising a symmetrical eight-shaped balun according to the invention. The balun may be an individual component of such a device, or may form part of an IC, which IC is incorporated in the device.

In yet a further aspect, the present invention relates to a communications device or single-ended device for differential conversion or vice versa, comprising a symmetrical eight-shaped balun according to according to the invention.

The present invention is applicable for all wireless modems and broadcast receivers and transmitters, using baluns or transformers. Such as devices to convert single-ended signals to differential or vice-versa, or as impedance transformers or as a part of matching networks.

Therefore, the invention is especially applicable to devices that are developed by Semiconductor industries in the mobile and portable space, e.g., TV FE, Mobile/Portable/terrestrial/satellite/cable/modem cable receivers, Connectivity devices such as Bluetooth, Wireless LAN, etc., RF Products, such as WiMax/Wibro, Personal products, such as TvoM, Cellular products, such as GSM, EDGE, UMTS, CDMA, etc. etc.

The present balun may be manufactured using, e.g., any typical process available now or in the future, such as those used in semiconductor industry, or other similar processes. The person skilled in the art will appreciate various process options therein, and will further appreciate possibilities offered by the various processes, being specific for those processes.

The present invention is further elucidated by the following figures and examples, which are not intended to limit the scope of the invention. The person skilled in the art will understand that various embodiments may be combined.

FIG. 1. Receiver path showing the use of a balun between the LNA and the mixer. This is a general layout of a prior art configuration, further comprising an antenna, for communication purposes, and an input matching network.

FIG. 2. Transmitter path with the balun placed between the last amplification stage and the output-matching network. This is a general layout of a prior art configuration, further comprising an antenna, for communication purposes, and a power gain amplifier.

FIG. 3A. Prior Art (from U.S. Pat. No. 5,477,204). The balun shown is clearly not symmetrical, and is therefore not well balanced. Further, conducting tracks of primary turns are not balanced mutually, nor are secondary turns.

FIG. 3B. Electrical schematic relative to the prior art (FIG. 3A)

FIG. 3C. Electrical schematic relative to FIG. 3A, with figured primary and secondary currents. FIGS. 3A-3C are described in more detail above.

Figure 4A:
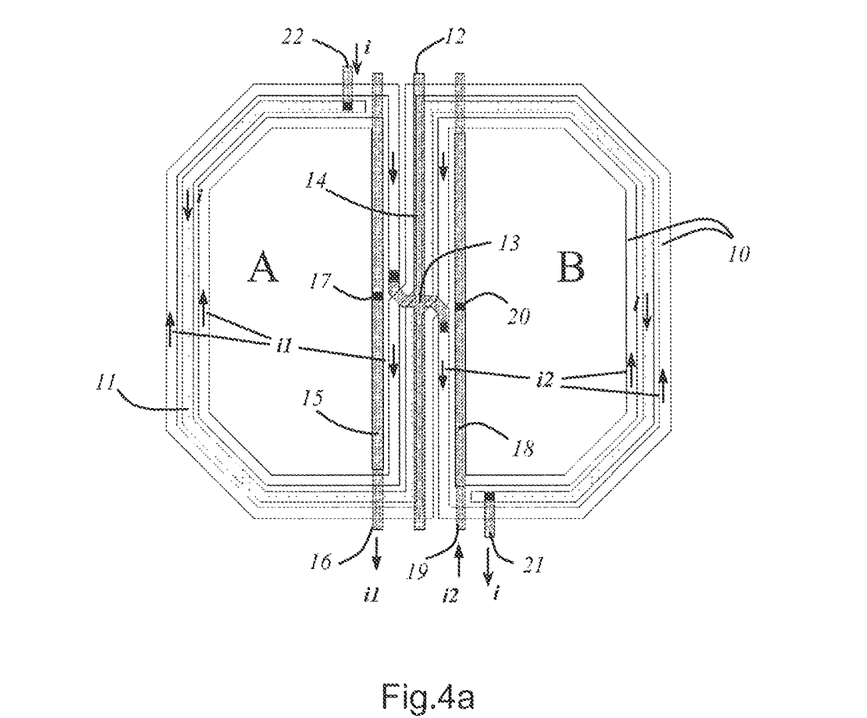
FIG. 4A. Balun drawing of the proposed invention.

FIG. 4A. Balun drawing of the proposed invention. Reference numbers are explained above in detail.

Figure 4B:
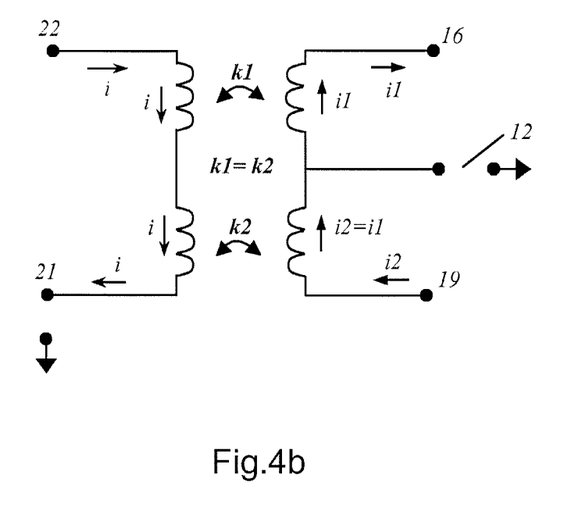
FIG. 4B. Equivalent electrical schematic relative to the balun given in FIG. 4A. Note that the induced differential current is the same on both output branches (16, 19).

FIG. 4B. Equivalent electrical schematic relative to the balun given in FIG. 4A. Note that the induced differential current is the same on both output branches (16, 19). In more detail, FIG. 4 describes a balun having:

Primary and secondary loops. These loops have an eight-shaped structure, such to reduce the outside magnetic field radiation and increase the internal mutual coupling. Such a balun, thanks to the eight-shaped structure, is immune against radiated magnetic fields or interferes caused by other sources.

The balun has equal primary turns between left and right sides, which is advantageous over the prior art.

The balun has equal secondary turns between left and right sides, which is advantageous over the prior art.

The geometrical and electrical middle points of primary and secondary loops (13) are superposed and located at the same level in the balun layout, which is advantageous over the prior art.

The primary and secondary loops have equal resistive and capacitive equivalent parasitic components, on left and right sides of the balun, which is advantageous over the prior art.

The magnetic coupling between primary and secondary loops has equal values, on left and right loops of the balun, which is advantageous over the prior art.

The balun's balanced internal terminals (17, 20) are connected to external terminals (16, 19) with another metal layer (15, 18) crossing the full layout, such to present equal capacitive loads to primary/secondary, left and right loops.

The connections with another metal layer (15, 18) are connected to the balanced internal terminals (17,20) at the middle axis level of the balun's layout, such to present equal resistive paths to left and right loops.

The balanced balun's middle point (13) is connected outwardly with an inferior metal layer (14), crossing the full layout, such to present equal capacitive loads to primary/secondary, left and right loops.

The balun presents highly differential balanced impedance, whether used as single-ended to differential transformer, or vice versa, which is advantageous over the prior art.

The balun features low insertion loss, whether used as single-ended to differential transformer, or vice versa, which is advantageous over the prior art.

In the case where the balun is used as differential to single-ended transformer, it features high common mode rejection which is advantageous over the prior art.

Figure 5A:
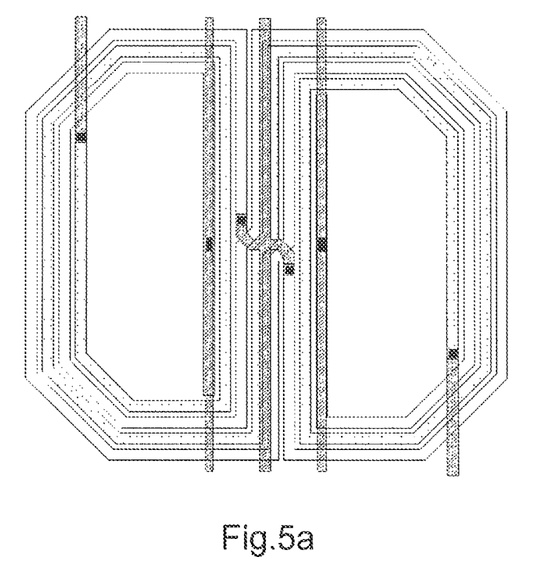
FIGS. 5A & 5B. Examples with increased turns number on the unbalanced balun's side, in order to vary the impedance transformation ratio.
Figure 5B:
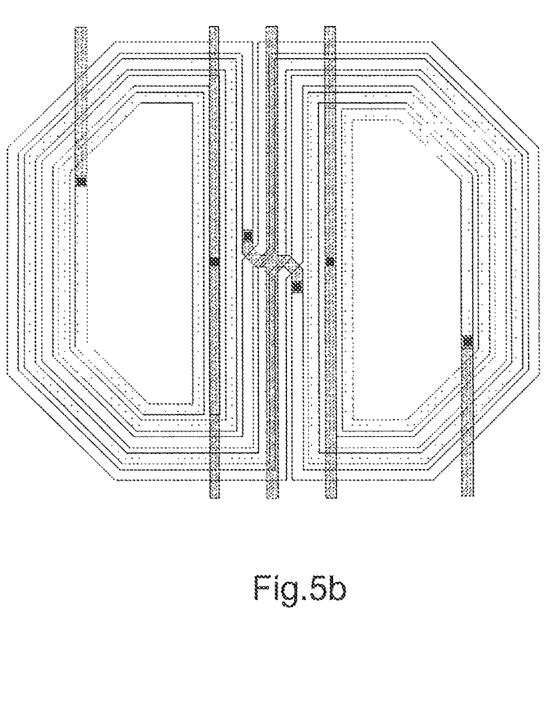

FIGS. 5A & 5B. Examples with increased number of turns on the unbalanced balun's side, in order to vary the impedance transformation ratio. Thus present baluns may have one turn per eye, two turns, three turns, etc., and varying other characteristics, to achieve a varying impedance transformation ratio. Such options are typically not provided with prior art baluns.

Figure 6A:
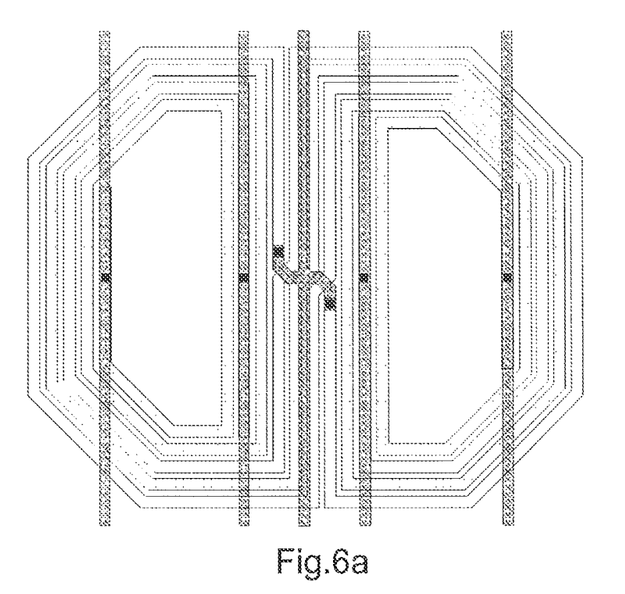
Figure 6B:
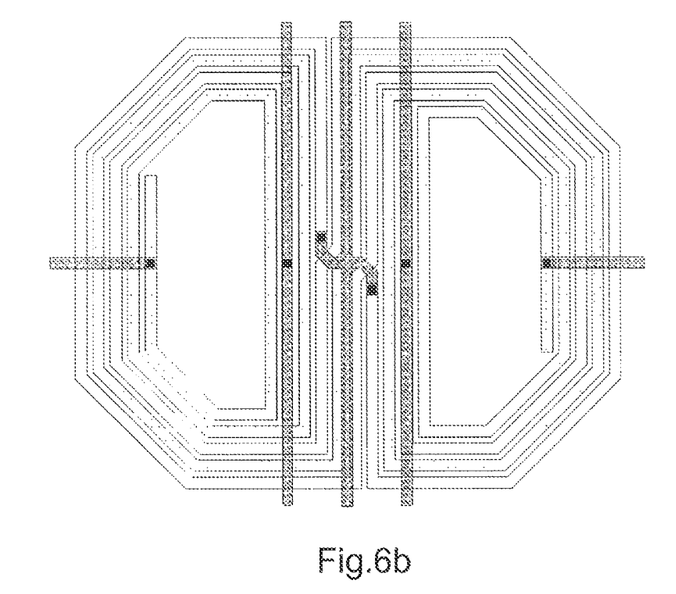
FIG. 6B: orthogonal sides.
Figure 6C:
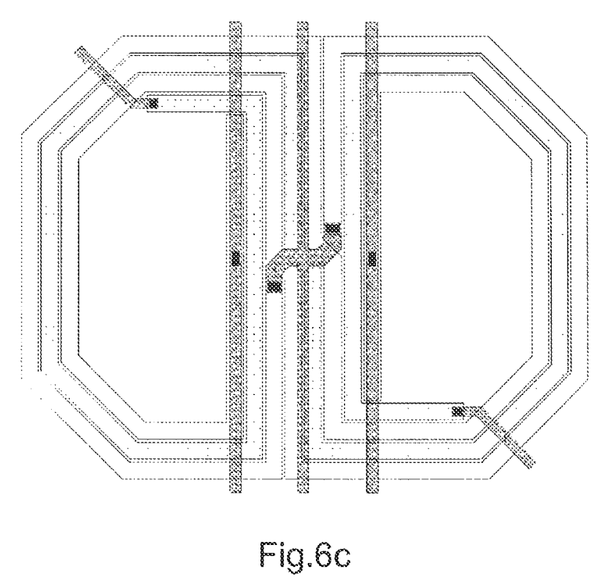
FIG. 6C: diagonal sides.

FIGS. 6A, 6B & 6C. Examples illustrating the flexibility in connecting the unbalanced terminals whether on
- FIG. 6A: the same or opposite side than the balanced terminals jointly or crossed configuration).
- FIG. 6B: orthogonal sides.
- FIG. 6C: diagonal sides. This Flexibility helps to minimize the capacitive, resistive and inductive parasitics due to external connections of the balun, whether on the unbalanced terminal side or on the terminal that should be connected to ground. It allows also to ease the orientation and placement of the balun such to further minimize the outside magnetic coupling.

Figure 7:
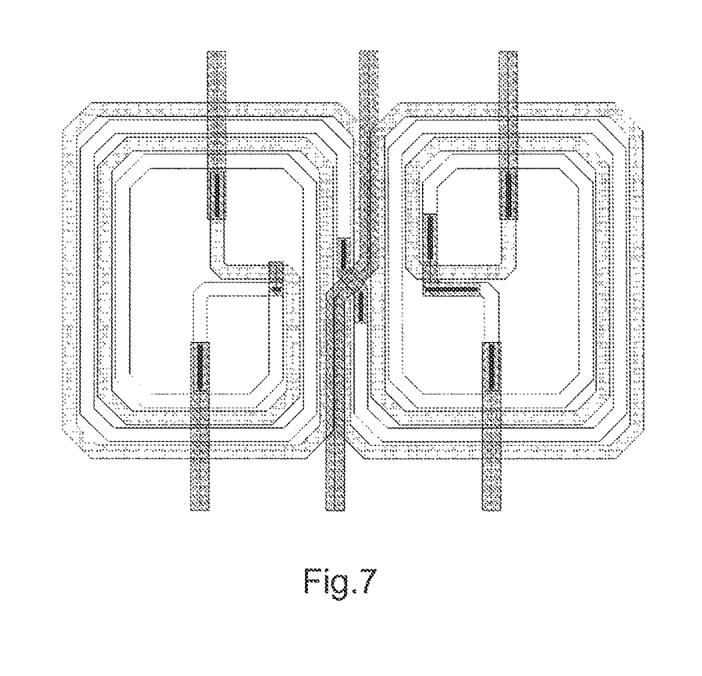
FIG. 7. Another example of unbalanced terminals connection on the same device's side, with reduced parasitic capacitance among connections and balun's turns.

FIG. 7. Another example of unbalanced terminals connection on the same device's side, with reduced parasitic capacitance among connections and balun's turns. The superposed areas between terminals connection and the internal turns of the balun's core are lessened in this example compared to the previous examples. This helps to reduce the global capacitive parasitics and the electrical losses due to that.

Thus, FIGS. 5-7 show further examples of the present balun, detailed in FIG. 4. Further observations relating to these figures are given below.

The present balun is built with interlaced primary and secondary loops, such as to achieve maximum magnetic flux transfer and minimum insertion loss. For seek of clearness, the balanced loops (10) of the balun are drawn with clear wires, and the unbalanced loops (11) are drawn with dotted wires in FIGS. 4A, 5A & 5B), although they preferably correspond both to the same metal layer. The dashed wires correspond to another connection metal layer (14, 15 & 18).

Depending on the use of the balun, whether, as single to differential transformer: the primary loop preferably corresponds to the unbalanced loop (11), and the secondary loop preferably to the balanced loop (10), or as differential to single transformer: the primary loop corresponds to the balanced loop (10), and the 30 secondary loop to the unbalanced loop (11).

The balun is preferably built such to have equal primary turns between left and right sides. The balun is preferably built such to have equal secondary turns between left and right sides. The balun is preferably built such to have the geometrical and electrical middle points of primary and secondary loops (13) superposed and located at the same level. The balun's primary and secondary loops preferably have substantially equal resistive and capacitive components, on left and right sides. Also, the magnetic coupling between primary and secondary loops has substantially equal values, on left and right loops.

The balun's balanced internal terminals (17,20) are preferably connected to external terminals (16, 19) with another metal layer (15, 18) crossing the full layout, such to present substantially equal capacitive loads to primary/secondary, left and right loops. Also, these connections with another metal layer (15, 18) are connected to the balanced internal terminals (17, 20) at the middle axis level of the balun's layout, such to present substantially equal resistive paths to left and right loops.

The balun is designed with respect to an eight-shaped structure. The currents, as shown in FIG. 4A, have opposite directions in the left and right turns, respectively through the primary and secondary loops, such to substantially reduce the outside magnetic field radiation and increase the internal mutual coupling. This increases also the balun's immunity against radiated magnetic fields or interferes caused by other sources.

The application of the techniques described in this invention can be extended to realize any impedance transformation ratio as required. It will consist mainly of increasing or decreasing the number of turns, whether in the primary or secondary loops. Two examples (FIGS. 5A & 5B) are given to illustrate this fact; the unbalanced turns (which could be the primary or the secondary loops, depending on the balun use (4)) are varied such to adapt the impedance transformation ratio to the required level, with respect to the substantially same layout techniques, features and advantages presented previously.

FIGS. 6A, 6B, 6C and 7 provide examples of flexibility in connecting the unbalanced terminals on any side (same or opposite than balanced terminals, jointly or in crossed configuration, orthogonal or diagonal sides), with respect to the substantially same layout techniques, features and advantages presented previously.

The embodiments depicted in FIGS. 4-6 also depict the feature that at least one of the primary and secondary loops—that is the electrical tracks forming the loops, forms successive turns alternately in the first and second eyes. In FIG. 4a, both the balanced conductive track (dotted) and the unbalanced conductive track (white) alternately form turns in the left eye (A) and the right eye (B). In each of FIGS. 5a-6c, the unbalanced conductive track (white) alternately form turns in the left and right eyes. That is, the unbalanced conductive track (white) forms a first turn in, e.g., the left eye, then crosses the center and forms a second turn in the right eye. The conductive track then again crosses the center and forms a third turn in the left eye, and so on. By crossing the center on each successive turn and forming the turns in alternate eyes of the eight-shaped balun, greater consistency and symmetry are achieved, optimizing the electromagnetic coupling between the primary and secondary turns.

Referring again to the balun layout in FIG. 4a and the equivalent circuit of FIG. 4b, note that, as described above, placing the vias 17 and 20 (connecting to terminals 16 and 19, respectively) at the center ensures and equal line length and results in substantially equal capacitive loads in the primary and secondary turns in the left and right eyes, ensuring symmetry. FIG. 4a depicts currents i1 and i2 flowing in terminal strips 16 and 19, respectively. As depicted, current i1 flows in the same direction in terminal strip 16 as in the underlying conductive track 10 forming the balanced side of the balun. Current i2, however, flows in the opposite direction in terminal strip 19 as in the underlying conductive track 10. In some cases, while the central position of the vias 17 and 20 ensure symmetry, the opposition of the directions of currents in the terminal strips 16, 19 may disturb the symmetry, reducing one or more of the advantages enumerated above.

Figure 8:
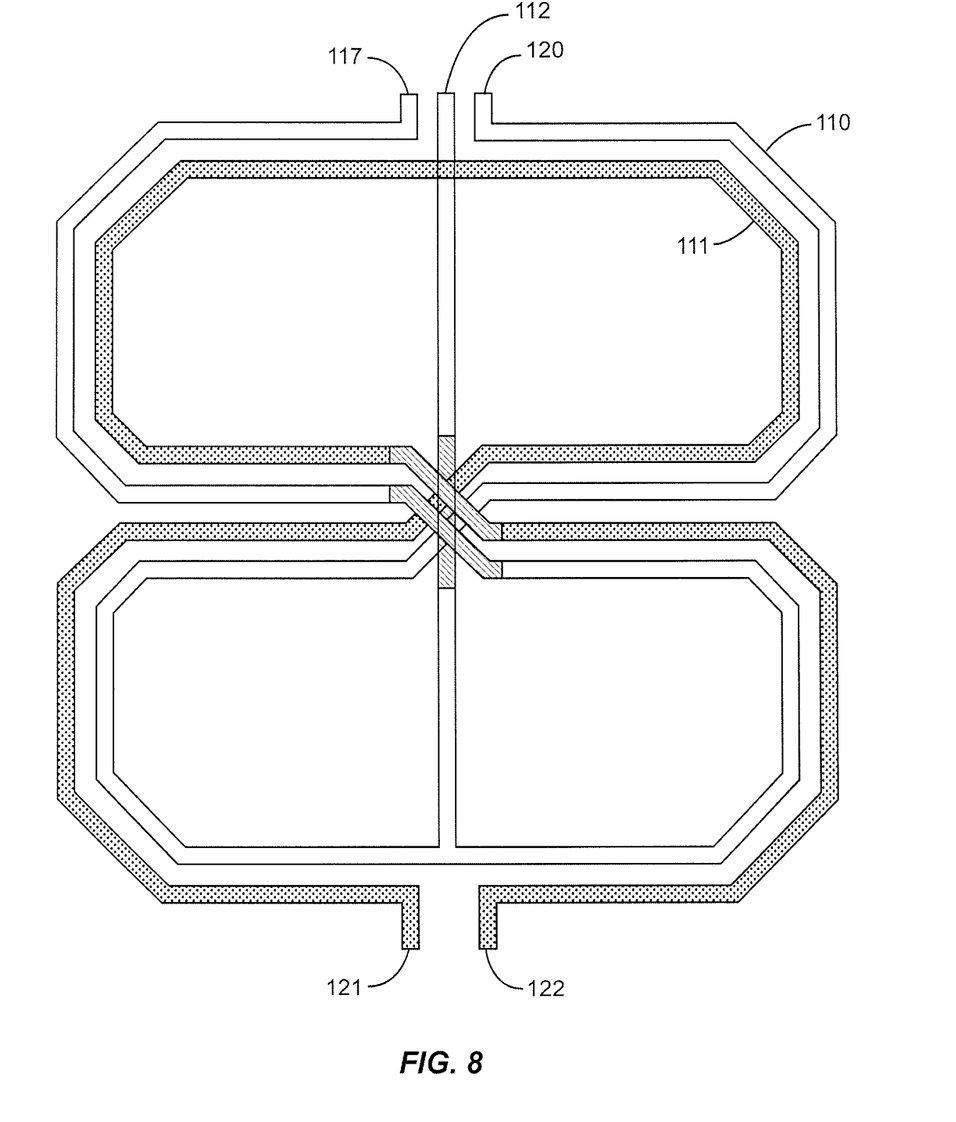
FIG. 8: A balun having both terminals for each of the primary and secondary turns arranged on a side.

FIG. 8 depicts an eight-shape blaun configuration wherein the balanced terminals 117, 120 are arranged on one side (as depicted, at the top) of the balun. Additionally, the center tap of the balanced side 112 is arranged at the side, with the balanced terminals 117, 120, although it must be routed to a different metal layer to cross the center of the balun in order to do so. Similarly, the unbalanced terminals 121, 122 are arranged at the opposite side (bottom) of the balun. This embodiment includes all of the properties previously described—that is, the blaun is eight-shaped; each of the primary and secondary turns have an equal track length, and equal number of loops, in each of the two balun eyes; and each conductive trace 110, 111 forms successive loops alternately in each eye. Accordingly, the same benefits described above—optimal internal magnetic coupling, minimizing interference by low magnetic field radiation, balancing capacitive loads, low insertion loss, and the like, accrue.

Figure 9:
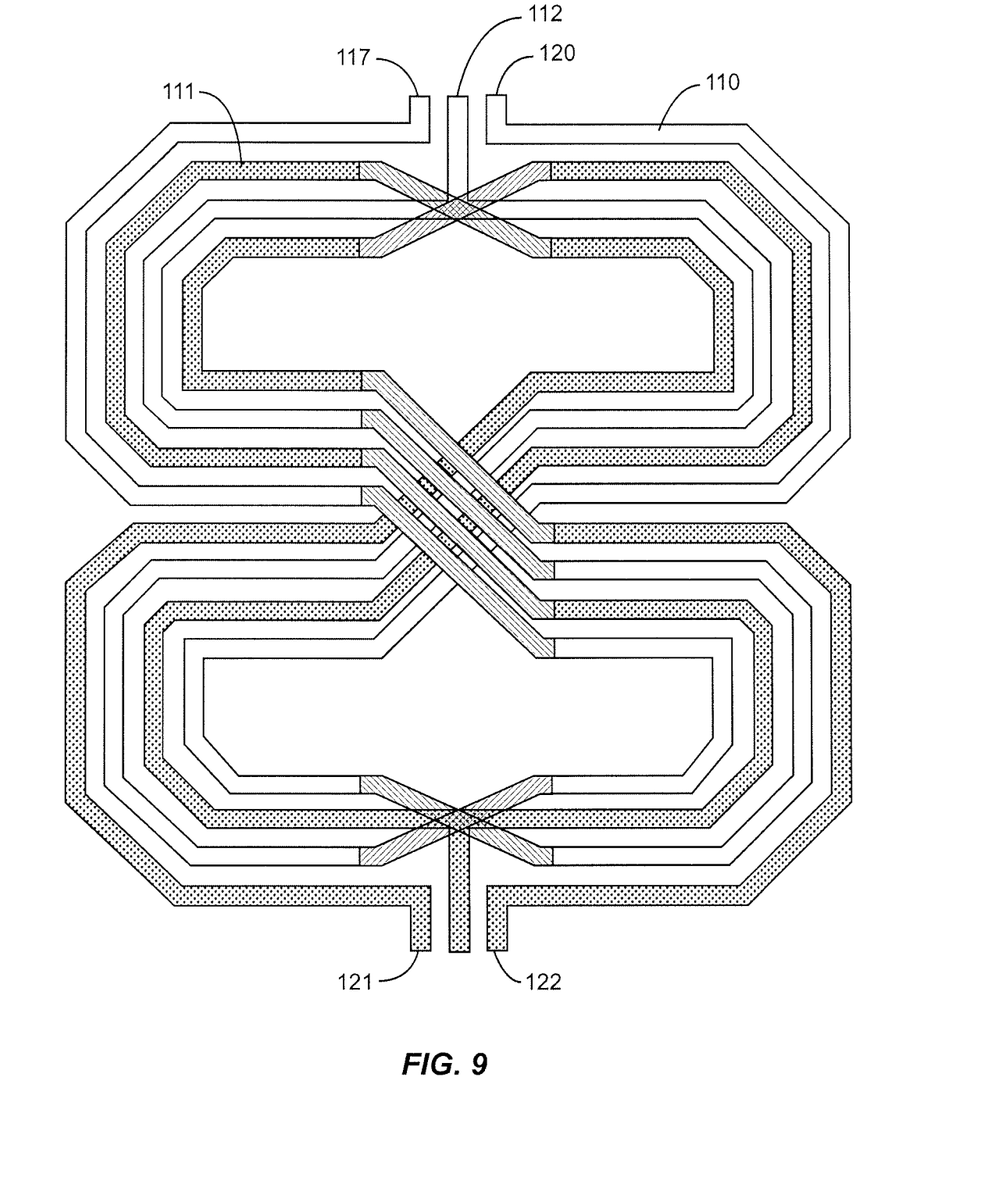
FIG. 9: A balun having both terminals and center tap for both primary and secondary turns arranged on the side.

FIG. 9 depicts an eight-shape balun configuration having multiple loops in each eye, and in which both the signal terminals and the center tap of each of the primary and secondary turns are arranged at the side. In this embodiment, either conductive track 110, 111 may be utilized as the balanced or unbalanced side of the balun. Strictly for the purpose of explanation, and ease of comparison with the balun of FIGS. 4a and 8, the conductive track 110 with terminals arranged at the top is denoted the balanced side, with the signal terminals numbered 117, 120, and the center tap numbered 112. Accordingly, the conductive track 111 with terminals arranged at the bottom is denoted the unbalanced side, with the signal terminals numbered 121, 122, and the center tap unnumbered, indicating an open circuit connection. Of course, those of skill in the art will readily recognize that the deployment of conductive tracks in the embodiment of FIG. 9 to the balanced and unbalanced sides of the balun may be reversed.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A symmetrical eight-shaped balun component, comprising:
    first and second electrically conductive tracks, the tracks shaped into turns forming a first eye and a second eye;
    wherein the first conductive track includes an equal number of turns in each of the first and second eyes, and wherein in operation an electrical current flows through the first track in a first direction in the first eye and in a second direction in the second eye, and wherein the first conductive track forms a first conducting path from a first terminal to a second terminal;
    wherein the second conductive track includes an equal number of turns in each of the first and second eyes, and wherein in operation an electrical current flows through the second track in a first direction in the first eye and in a second direction in the second eye, and wherein the second conductive track forms a second conducting path from a third terminal to a fourth terminal;
    wherein at least one of the first and second conductive tracks forms successive turns alternately in the first and second eyes; and
    wherein geometrical and electrical middle points of first and second conductive tracks are all superposed and are located in the same plane in the balun.

2. The balun of claim 1, wherein the first and second conductive tracks have substantially equal electrical resistance and substantially equivalent capacitive parasitic components.

3. The balun of claim 1 wherein a magnetic coupling between the first and second conductive tracks in each eye has equal values.

4. The balun of claim 1 wherein the first and second conductive tracks are formed in first metal layer, and further comprising:
    connections between the balun balanced internal terminals to external terminals using a second metal layer, different than the first metal layer, that crosses the full layout of the balun, so as to provide substantially equal capacitive loads to the first and second conductive tracks.

5. The balun of claim 4 wherein connections between the balanced internal terminals and the second metal layer are located at the middle axis level of the balun layout, so as to present equal resistive paths to first and second conductive tracks in the first and second eyes.

6. The balun of claim 4 further comprising
    a connection between the balun balanced middle point and an external terminal using a third metal layer, different than the first metal layer, that crosses the full layout of the balun, so as to provide substantially equal capacitive loads to the first and second conductive tracks.

7. The balun of claim 1 further wherein the first and second terminals are arranged at an exterior side of one eye, and wherein the third and fourth terminals are arranged at an exterior side of the other eye.

8. The balun of claim 7 further comprising a fifth terminal, arranged at the exterior side of one eye adjacent the first and second terminals, the fifth terminal connected to a center point of the first conductive track.

9. The balun of claim 8 wherein the first conductive track comprises an odd number of loops in each eye, and wherein the fifth terminal crosses the center of the balun between the center point of the first conductive track and the first and second terminals.

10. The balun of claim 8 wherein the first conductive track comprises an even number of loops in each eye, and wherein the fifth terminal does not cross the center of the balun between the center point of the first conductive track and the first and second terminals.

11. The balun of claim 8 further comprising a sixth terminal, arranged at the exterior side of the other eye adjacent the second and third terminals, the sixth terminal connected to a center point of the second conductive track.

12. A wireless communication device, comprising:
    one or more of a transmitter or receiver circuit operative to convert a signal to be transmitted or a received signal, respectively between a single-ended signal and a differential signal, the transmitter or receiver circuit including a balun to perform the conversion, the balun comprising first and second electrically conductive tracks, the tracks shaped into turns forming a first eye and a second eye;
    wherein the first conductive track of the balun includes an equal number of turns in each of the first and second eyes, and wherein in operation an electrical current flows through the first track in a first direction in the first eye and in a second direction in the second eye, and wherein the first conductive track forms a first conducting path from a first terminal to a second terminal;
    wherein the second conductive track of the balun includes an equal number of turns in each of the first and second eyes, and wherein in operation an electrical current flows through the second track in a first direction in the first eye and in a second direction in the second eye, and wherein the second conductive track forms a second conducting path from a third terminal to a fourth terminal;
    wherein at least one of the first and second conductive tracks of the balun forms successive turns alternately in the first and second eyes; and
    wherein geometrical and electrical middle points of first and second conductive tracks of the balun are all superposed and are located in the same plane in the balun.

* * * * *